(12) United States Patent  (10) Patent No.: US 8,580,647 B2
Yen et al.  (45) Date of Patent: Nov. 12, 2013

(54) INDUCTORS WITH THROUGH VIAS

(75) Inventors: Hsiao-Tsung Yen, Tainan (TW); Yu-Ling Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/330,127

(22) Filed: Dec. 19, 2011

(65) Prior Publication Data

US 2013/0154053 A1  Jun. 20, 2013

(51) Int. Cl.
*H01L 21/20* (2006.01)

(52) U.S. Cl.
USPC ........... 438/381; 438/238; 438/329; 438/421; 257/516; 257/528; 257/531; 257/668; 257/E21.022

(58) Field of Classification Search
None
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,140,197 A * | 10/2000 | Chu et al. .............. 438/381 |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |

* cited by examiner

*Primary Examiner* — Kyoung Lee
(74) *Attorney, Agent, or Firm* — Slater & Matsil, L.L.P.

(57) ABSTRACT

A device using an inductor with one or more through vias, and a method of manufacture is provided. In an embodiment, an inductor is formed in one or more of the metallization layers. One or more through vias are positioned directly below the inductor. The through vias may extend through one or more dielectric layers interposed between a substrate and the inductors. Additionally, the through vias may extend completely or partially through the substrate.

19 Claims, 7 Drawing Sheets

INDUCTORS WITH THROUGH VIAS

BACKGROUND

An inductor is a passive device which is used to store energy in a magnetic field and may be used in many integrated circuits, such as radio-frequency (RF) circuits. Inductors have measurable inductance (L), which is a measure of the magnetic field generated from the conductor. Inductance may vary according to the number of loops, loop sizes, wire diameter, etc. that make up the inductor. It is often desirable that the inductors have high inductance values. High inductance values, however, may be difficult to achieve on integrated circuits because of various intrinsic characteristics of the inductor itself such as resistance and capacitance, as well as some inductive effects such as eddie currents, which may have an adverse effect on the surrounding semiconductor substrate and/or surrounding circuits.

The resistive and capacitive components of the inductor may adversely affect the Q-factor (Quality) and $F_{SR}$ (Self-Resonant Frequency) of the inductor. The Q-factor is a measure of the inductors efficiency and is a ratio of the inductance to its resistance at a given frequency. Higher Q-factor values indicate a lower rate of energy loss. The $F_{SR}$ of an inductor is the natural frequency in which it oscillates freely.

Eddy currents are magnetic waveforms given off by the energized inductor. These currents are generally induced into the surrounding conductive materials when a conductor is exposed to a changing magnetic field. Eddy currents are circulating flows of electrons surrounding the body of the conductor. Eddie currents generate electromagnetic forces which cause heating and power loss when applied to the inherent resistive and capacitive components present in the substrate. This power loss may in turn adversely affects the Q and $F_{SR}$ components of an inductor.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the embodiments provide many applicable inventive concepts that can be embodied in a wide variety of specific contexts. The specific embodiments discussed are merely illustrative of specific ways to make and use the disclosure, and do not limit the scope of the disclosure.

A method and apparatus using through vias (TVs) is provided for improving the Quality (Q) and self-resonant frequency ($F_{SR}$) of inductor-based circuits. Embodiments such as those discussed herein may reduce eddy currents and substrate capacitance of the integrated inductive component through the use of TVs. Throughout the various views and illustrative embodiments of the present disclosure, like reference numbers are used to designate like elements.

Figure 1:
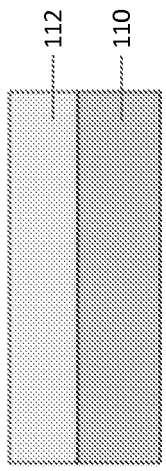
FIGS. 1-5B illustrate intermediate stages in forming a device that may be used in accordance with an embodiment.

FIG. 1 illustrates a substrate 110 with one or more overlying dielectric layers 112. The substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate, may also be used.

It should be noted that FIG. 1 (as well as the other remaining figures) are simplified to better illustrate the features of embodiments. For example, in an embodiment, the substrate 110 may include electrical circuitry (not shown) suitable for a particular application. In an embodiment, the circuitry includes electrical devices formed on the substrate with one or more subsequently formed dielectric layers overlying the electrical devices. One or more metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

The one or more dielectric layers 112 may represent, for example, an inter-layer dielectric (ILD) layer and/or one or more inter-metal dielectric (IMD) layers. In an embodiment the one or more dielectric layers 112 may be formed of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD).

It should be noted that the one or more dielectric layers 112 is illustrated as a single layer for illustrative purposes only. Different embodiments may include a plurality of layers formed of the same or different materials, and may include intermediate metallization layers (such as may be the case in which the one or more dielectric layers 112 includes one or more inter-metal dielectric layers). Furthermore, the one or more dielectric layers 112 may include one or more etch stop layers.

Figure 2B:
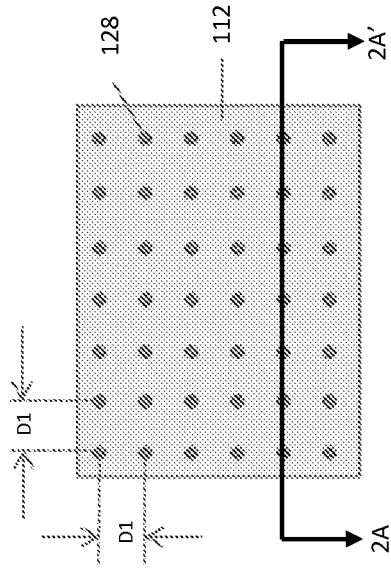
Figure 2A:
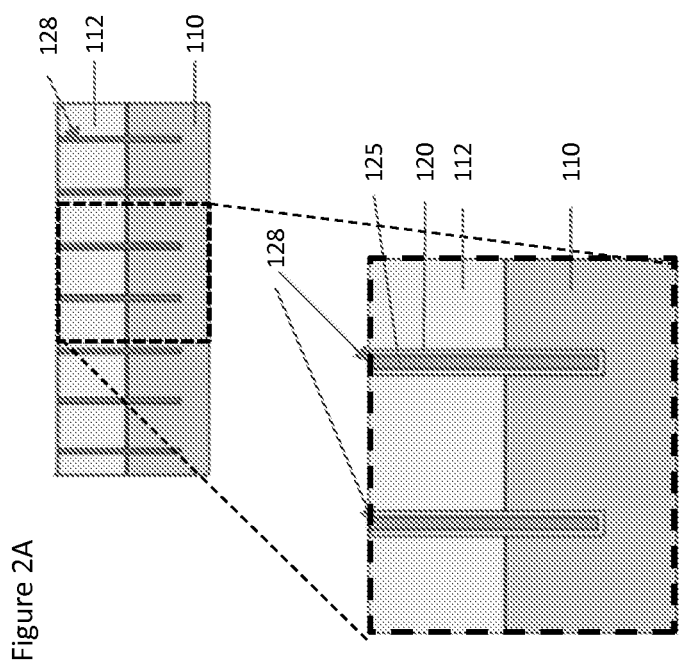

FIGS. 2A and 2B illustrate a cross-sectional view and a plan view, respectively, of the structure of FIG. 1 after through vias 128 (TVs) have been formed in accordance with an embodiment, wherein FIG. 2A is a cross-sectional view along the 2A-2A' line of FIG. 2B. As illustrated in FIG. 2A, the TVs extend through the one or more dielectric layers 112 and into the substrate 110. The TVs 128 may be formed by any appropriate method. For example, openings may be formed through the one or more dielectric layers 112 and extending into the substrate 110 by, for example, one or more etching processes, milling, laser techniques, or the like. As illustrated in the inset of FIG. 2A, the openings may be lined with a liner 120, such as SiO, SiN, TEOS, and/or the like, that act as an isolation layer. Thereafter, the openings may be filled with a conductive filler 125, such as copper, tungsten, aluminum, silver, and combinations thereof, or the like, thereby forming the TVs 128. Other materials, including conductive diffusion barrier layers, such as TaN, Ta, TiN, Ti, CoW, or the like, may also be used.

FIG. 2B is a plan view and illustrates a placement of the TVs 128 in the substrate 110. In an embodiment, a distance D1 between adjacent TVs may be from about 10 μm to about 30 μm. Other embodiments may utilize different arrangements and/or spacings.

Figure 3:
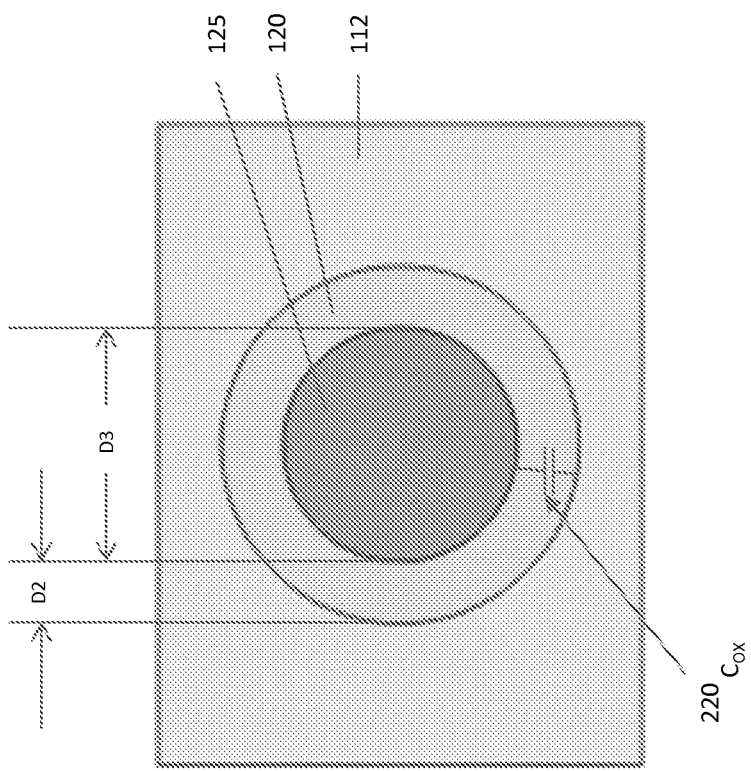

As illustrated in FIG. 3, in an embodiment, the liner 120 may have a thickness D2 of about 0.1 μm to about 1.5 μm, and a diameter D3 of the conductive filler 125 may be from about 5 μm to about 7 μm, although other thicknesses may be used in other embodiments. The liner 120 of the TVs 128 is a dielectric material interposed between the conductive TV conductor 125 and the substrate 110, and therefore includes a capacitance value designated as the Oxide Capacitance 220 ($C_{ox}$). The substrate 110, or a well (not shown) in the substrate 110, may be doped with either n-type or p-type impurities. In an embodiment, the substrate 110 is grounded. The $C_{ox}$ may be designed to be larger than the substrate equivalent capacitance which is typically 25 fF. In an embodiment, a $C_{ox}$ capacitance is between about 100 fF and about 200 fF. Furthermore, in an embodiment, the $C_{ox}$ capacitance of the TVs 128 provides a series capacitance in the substrate 110 which may effectively reduce the substrate capacitance. Reducing the substrate capacitance may in turn reduce the RC effect of the substrate and improve the Inductor Q and $F_{SR}$. In an alternative embodiment, the TV 128 may be completely filled with a dielectric material without the conductive filler 125.

Figure 4A:
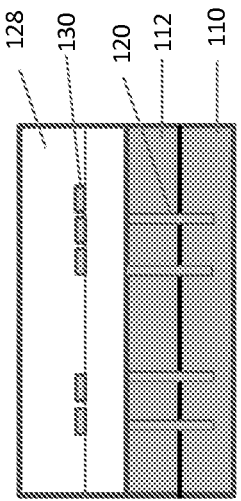
Figure 4B:
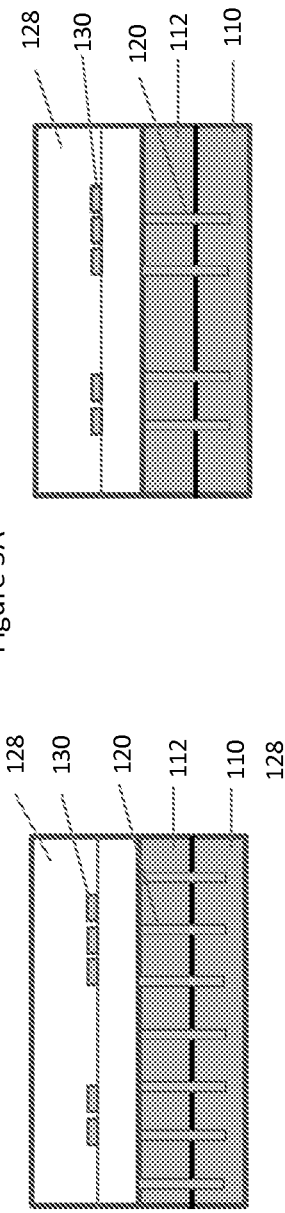

FIGS. 4A-4B illustrate a cross-sectional view and a plan view, respectively, after forming one or more additional dielectric layers 132 in accordance with an embodiment, wherein FIG. 4A is a cross-sectional view along the 4A-4A' line illustrated in FIG. 4B. The one or more dielectric layers 132 may comprise one or more inter-metal dielectric (IMD) layers and the associated metallization layers. Generally, the one or more IMD layers and the associated metallization layers are used to interconnect the electrical circuitry (not shown) to each other and to provide an external electrical connection. The IMD layers may be formed of a low-K dielectric material, such as FSG formed by PECVD techniques or high-density plasma CVD (HDPCVD), or the like, and may include intermediate etch stop layers. Contacts (not shown) may be provided in the uppermost IMD layer to provide external electrical connections. The metallization layers may comprise of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like.

It should also be noted that one or more etch stop layers (not shown) may be positioned between adjacent ones of the dielectric layers 112 and 132, e.g., the ILD layer and the IMD layers. Generally, the etch stop layers provide a mechanism to stop an etching process when forming vias and/or contacts. The etch stop layers are formed of a dielectric material having a different etch selectivity from adjacent layers, e.g., the underlying substrate 110, the overlying ILD layer, and the overlying IMD layers. In an embodiment, etch stop layers may be formed of SiN, SiCN, SiCO, CN, combinations thereof, or the like, deposited by CVD or PECVD techniques.

Also shown in FIGS. 4A and 4B is an inductor 130 formed in one or more of the metallization layers in accordance with an embodiment. As shown in FIG. 4B, the inductor 130 in this embodiment comprises a conductive element shaped in a spiral pattern and having two terminals 140 and 141. In this embodiment, a cross-over region (indicated in FIG. 4B by the dotted circle 142) comprises a region where terminal "passes over" the spirals. This may be achieved by, for example, the spirals extending down to an underlying metallization layer, traversing under the terminal 141, and extending back up to the spirals on the opposing side of the terminal 141.

The inductor 130 illustrated in FIGS. 4A and 4B is for illustrative purposes only and various embodiments may utilize different sizes and patterns, contain crossovers, and occupy multiple metal layers.

As illustrated in FIG. 4B, in an embodiment the TVs 128 are formed in a pattern of rows and columns throughout a region underlying the TVs, such that when the IMD and metal layers are added, the conductor will be located directly over some, but not necessarily all, of the TVs. The embodiment illustrated in FIG. 4B illustrates that the inductor traces are directly above some of the TVs and not directly above others. While this pattern of TVs may be suitable for the inductor 130 in this embodiment, other embodiments may position the inductor differently and therefore the TV pattern may be altered to better coordinate TV placement under the inductor traces. In yet another embodiment, the application may require that the inductor be multi-layered, of different physical size, different trace width, different physical shape, and/or the like, where a different TV pattern may be more conducive to placing additional TVs directly below the inductor traces. Accordingly, more TVs located directly under the inductor traces may enhance the performance of the circuit, whereas TVs not located directly under the inductor traces may have less or no impact.

Figure 5A:
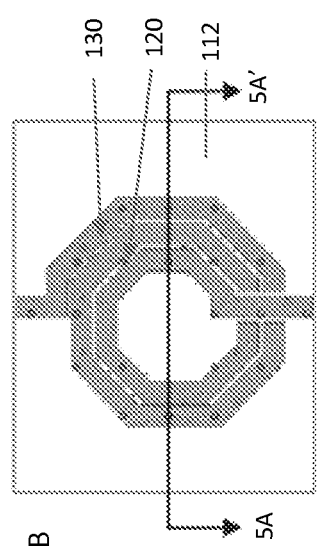
Figure 5B:
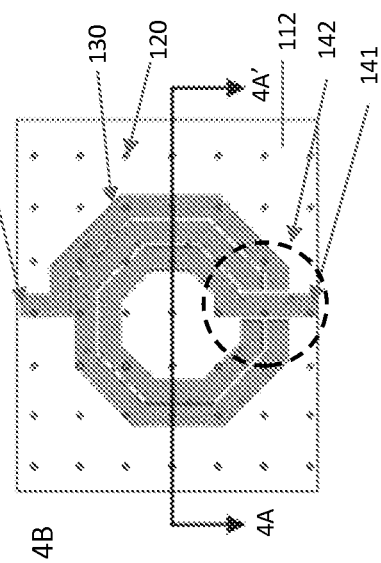

FIGS. 5A-5B illustrate another embodiment wherein TVs may be patterned in the substrate 110 according to the placement of the inductor 130 in the metal layers above, wherein FIG. 5A illustrates a cross-sectional view along the 5A-5A' line of FIG. 5B. In this embodiment the inductor 130 is similar to that discussed above. In this embodiment the TVs have been placed in the substrate under the inductor traces, and the TVs positioned out from directly under the inductor traces have been removed. As discussed above, other embodiments of inductors may have other physical shapes, sizes, trace widths and/or the like.

Figure 6A:
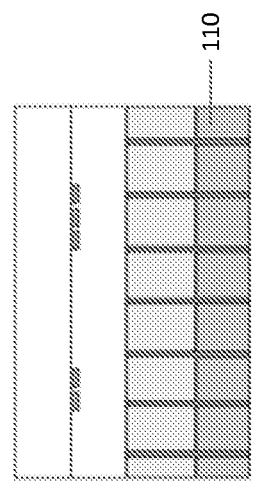
FIGS. 6A and 6B illustrate cross-sectional views of alternative embodiments.
Figure 6B:
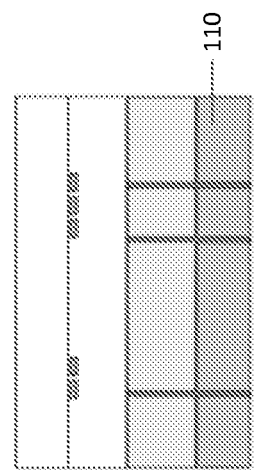

FIGS. 6A and 6B illustrate a thinning process that may be performed on a backside of the semiconductor substrate 110 of FIGS. 4A and 5A, respectively, to expose the TVs 128 in accordance with an embodiment of the present invention. The thinning process may be performed using an etching process and/or a planarization process, such as a mechanical grinding process or a chemical mechanical polishing (CMP) process. For example, initially a planarizing process, such as grinding or a CMP, may be performed to initially expose the liner 120. Thereafter, one or more wet etching processes having a high etch-rate selectivity between the material of the liner 120 and the substrate 110 may be performed, thereby leaving the through via 128 protruding from the backside of the semiconductor substrate 110 as illustrated in FIGS. 6A and 6B. The etch process may be, for example, a dry etch process using $HBr/O_2$, $HBr/Cl_2/O_2$, $SF_6/CL_2$, $SF_6$ plasma, or the like. It should be noted, however, that in other embodiments, the through via 128 may not protrude from the backside of the semiconductor substrate 110.

Figure 7A:
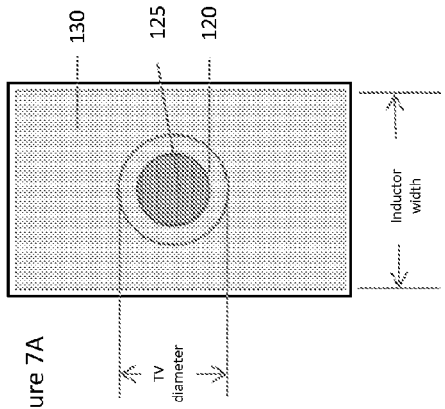
FIGS. 7A-7D illustrate various through via sizes that may be used in accordance with embodiments.
Figure 7D:
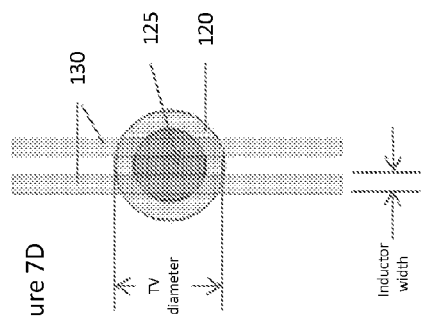
Figure 7C:
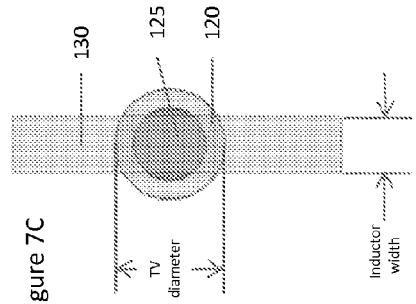
Figure 7B:
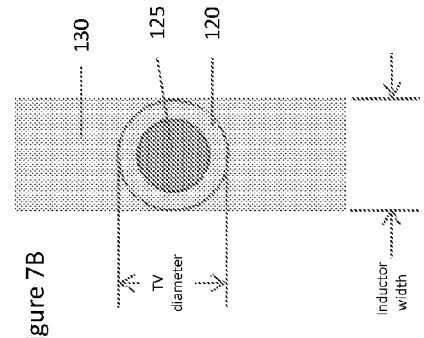

The embodiments illustrated in FIGS. 1-6 illustrate embodiments in which the conductive filler material 125 of the TVs 120 are not directly connected to other components or to each other via a conductive line in, e.g., conductive traces or a metallization layer along either side of the substrate. In other embodiments, however, conductive traces or a metallization layer (along either side of the substrate) may be used to couple one or more of the TVs together or to, e.g., couple one or more of the TVs to a guard ring extending around the die or to a guard ring extending around only the inductor. In another embodiment, the substrate is electrically grounded and the TVs are not directly coupled together. These embodiments may be utilized to vary the substrate network for a particular implementation. In an embodiment, the TVs are dummy TVs FIGS. 7A-7D illustrate different embodiments of TVs of varying sizes relative to the inductor traces. FIG. 7A illustrates an embodiment wherein a width of the inductor trace exceeds the overall diameter of the TV. FIG. 7B illustrates an embodiment in which the inductor trace 130 has a width approximately the same as a diameter of the TV; FIG. 7C illustrates an embodiment in which a width of the inductor trace is less than a diameter of the TV; and FIG. 7D illustrates an embodiment in which the diameter of the TV is such that a single TV underlies a plurality of inductor traces. It is believed that in some embodiments configurations such as those illustrated in FIGS. 7B-7D may help provide additional control of the eddy currents as compared to the configuration of FIG. 7A.

Figure 8A:
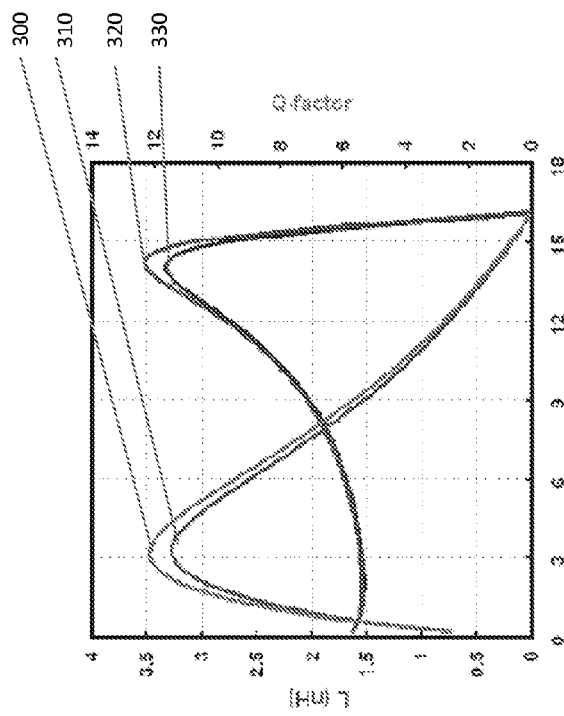
FIGS. 8A and 8B illustrate electrical characteristics that may be achieved using embodiments such as those disclosed herein.

FIG. 8A illustrates an improvement in the inductance (L) and the Q-factor that may be obtained using embodiments such as those described herein. As illustrated in FIG. 8A, the measured inductance (L) and Q-factor of the inductive circuit vary according to the electromagnetic response of the inductor. A noticeable improvement in the inductance (L) 320 (as compared to 330) and the Q 300 (as compared to 310) of the inductor may be realized through the use of TVs.

Figure 8B:
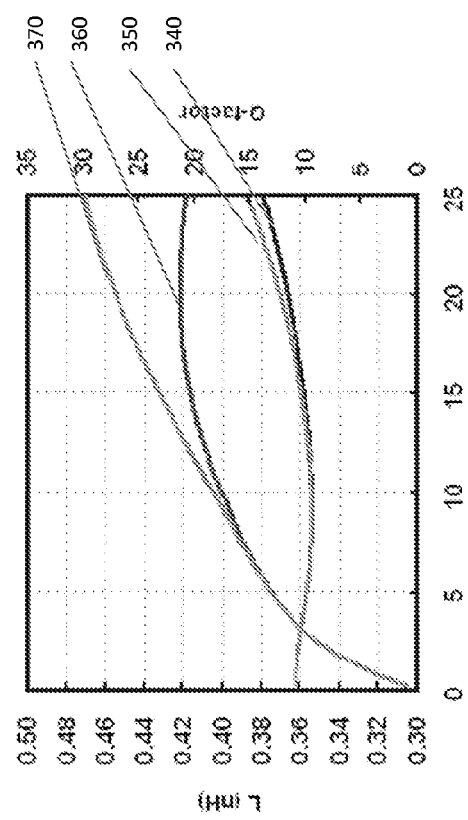

FIG. 8B illustrates before-after data that illustrates advantages of embodiments such as those disclosed herein. In FIG. 8B, the measured inductance (L) and Q-factor of the inductive circuit vary according to the frequency applied to the inductor. A noticeable improvement in the inductance (L) 370 (as compared to 360) and the Q-factor 350 (as compared to 340) of the inductor may be realized through the use of TVs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An apparatus comprising:
   a substrate;
   one or more dielectric layers overlying the substrate;
   one or more dummy vias extending through one or more of the one or more dielectric layers; and
   an inductor overlying the one or more vias, wherein the one or more vias are not electrically coupled to the inductor.

2. The apparatus of claim 1, wherein the one or more vias extend into the substrate.

3. The apparatus of claim 1, wherein the one or more vias extend through the substrate.

4. The apparatus of claim 1, wherein the one or more vias are positioned directly below the inductor.

5. The apparatus of claim 1, wherein a diameter of the one or more vias is equal to or greater than a width of a trace of the inductor.

6. An apparatus comprising:
   a substrate having a plurality of overlying dielectric layers;
   at least one through via extending into the substrate; and
   an inductor formed in one or more of the dielectric layers, at least a portion of the inductor directly overlying the at least one through via.

7. The apparatus of claim 6, wherein the at least one through via comprises a dielectric liner and a conductive fill material.

8. The apparatus of claim 7, wherein the liner has a thickness from about 0.1 μm to about 1.5 μm.

9. The apparatus of claim 6, wherein the at least one through via extends completely through the substrate.

10. The apparatus of claim 6, wherein the inductor and the at least one through via is separated by one of more dielectric layers.

11. The apparatus of claim 6, further comprising one or more through vias not directly underlying the inductor, the one or more through vias not directly underlying the inductor being electrically isolated.

12. The apparatus of claim 6, wherein the at least one through via is filled with a dielectric material.

13. A method of forming an electrical device:
    providing a substrate;
    forming one or more first dielectric layers over the substrate;
    forming one or more through vias through at least one of the one or more first dielectric layers;
    forming a plurality of second dielectric layers over the through vias; and
    forming an inductor in one or more of the plurality of second dielectric layers, the inductor directly overlying at least some of the through vias, the inductor being separated by the one or more through vias by at least one of the plurality of second dielectric layers.

14. The method of claim 13, wherein the forming the one or more through vias comprises:
    forming holes through the one or more first dielectric layers;
    forming a dielectric liner along surfaces of the holes; and
    forming a conductive material over the dielectric liner.

15. The method of claim 13, wherein a diameter of the one or more vias is equal to or greater than a width of a trace of the inductor.

16. The method of claim 13, wherein a diameter of the one or more vias is greater than twice a width of a trace of the inductor.

17. The method of claim 13, wherein the forming the one or more through vias comprises forming one or more through vias extending into the substrate.

18. The method of claim 17, further comprising thinning a backside of the substrate, thereby exposing the one or more through vias.

19. The method of claim 13, wherein the through vias are filled with a dielectric material.

* * * * *